United States Patent
McCune et al.

(10) Patent No.: US 10,143,101 B2
(45) Date of Patent: *Nov. 27, 2018

(54) PV STAX—MULTI-FUNCTION JUNCTION MF/J SYSTEM

(71) Applicants: Chuck McCune, Albuquerque, NM (US); Maxim K. Rice, Albuquerque, NM (US); Scott Richard Wilson, Corrales, NM (US)

(72) Inventors: Chuck McCune, Albuquerque, NM (US); Maxim K. Rice, Albuquerque, NM (US); Scott Richard Wilson, Corrales, NM (US)

(73) Assignee: Chuck McCune, Albuquerque, NM (US)

( * ) Notice: Subject to any disclaimer, the term of this patent is extended or adjusted under 35 U.S.C. 154(b) by 158 days.

This patent is subject to a terminal disclaimer.

(21) Appl. No.: 14/829,589

(22) Filed: Aug. 18, 2015

(65) Prior Publication Data

US 2016/0073533 A1    Mar. 10, 2016

Related U.S. Application Data

(63) Continuation-in-part of application No. 14/204,395, filed on Mar. 11, 2014.

(Continued)

(51) Int. Cl.
*G05D 3/12* (2006.01)
*G05D 5/00* (2006.01)
(Continued)

(52) U.S. Cl.
CPC ............... *H05K 7/023* (2013.01); *G05B 9/02* (2013.01); *H01R 13/73* (2013.01); *H01R 24/30* (2013.01);

(Continued)

(58) Field of Classification Search
CPC ......... H05K 7/023; H02S 40/32; H02S 40/34; G05B 9/02; H01R 13/73; H01R 24/30; H01H 9/04; H01H 9/168; H01H 2300/03
(Continued)

(56) References Cited

U.S. PATENT DOCUMENTS 4,628,306 A    12/1986  Root et al.
8,242,634 B2    8/2012  Schatz et al.
(Continued)

OTHER PUBLICATIONS

McCune, "PV Stoptm—Potential Voltage and Hazard Stop System for Licensing & Distribution under the Trademark", http://solarprofessional.com/resources/press/mccune-works-inc/pv-stoptm-potential-voltage-and-hazard-stop-system-for-licensing, Jun. 14, 2013.

(Continued)

*Primary Examiner* — Mohammad Ali
*Assistant Examiner* — Md Azad
(74) *Attorney, Agent, or Firm* — Justin R. Jackson; Jeffrey D. Myers; Peacock Law P.C.

(57) ABSTRACT

A system to provide a multi-function connection capability to contain and provide for stacking, mounting self-registering Multi-Function Junction (MF/J) boxes that contain a multiplicity of control electronics and can be stacked, removed, replaced, and/or upgraded with a minimal of steps or connection processes in order to simplify methods and conserve on or add value, capabilities to materials and electrical/mechanical equipment. The system can be engaged or utilized by any EMS/First Responder/Service Technician, authorized personnel in any field, Contractor, manufacturer, BOS integrator and any assembler of systems that require a multiplicity of interfacing devices to be in proximity, connection or contact to each other.

4 Claims, 3 Drawing Sheets

Related U.S. Application Data

(60) Provisional application No. 62/039,379, filed on Aug. 19, 2014, provisional application No. 61/778,048, filed on Mar. 12, 2013, provisional application No. 61/819,640, filed on May 5, 2013.

(51) Int. Cl.

| | |
|---|---|
| *G05D 9/00* | (2006.01) |
| *G05D 11/00* | (2006.01) |
| *G05D 17/00* | (2006.01) |
| *H05K 7/02* | (2006.01) |
| *H02S 40/34* | (2014.01) |
| *H02S 40/32* | (2014.01) |
| *H01R 24/30* | (2011.01) |
| *H01R 13/73* | (2006.01) |
| *G05B 9/02* | (2006.01) |
| *H01R 105/00* | (2006.01) |
| *H01H 9/16* | (2006.01) |
| *H01H 9/04* | (2006.01) |

(52) U.S. Cl.
CPC .............. *H02S 40/32* (2014.12); *H02S 40/34* (2014.12); *H01H 9/04* (2013.01); *H01H 9/168* (2013.01); *H01H 2300/03* (2013.01); *H01R 2105/00* (2013.01); *Y02B 90/224* (2013.01); *Y04S 20/14* (2013.01)

(58) Field of Classification Search
USPC .............................. 700/293; 307/77, 80, 130
See application file for complete search history.

(56) References Cited

U.S. PATENT DOCUMENTS

| | | | |
|---|---|---|---|
| 8,446,042 B2 | 5/2013 | Bundschuh et al. | |
| 8,446,043 B1 | 5/2013 | Bundschuh et al. | |
| 8,461,718 B2 | 6/2013 | Bundschuh et al. | |
| 8,471,408 B2 | 6/2013 | Bundschuh et al. | |
| 8,854,193 B2 | 10/2014 | Makhota et al. | |
| 2009/0084426 A1 | 4/2009 | Fornage et al. | |
| 2009/0207543 A1* | 8/2009 | Boniface ................. | H02H 3/16 361/86 |
| 2010/0071744 A1 | 3/2010 | Peurach et al. | |
| 2010/0139734 A1 | 6/2010 | Hadar et al. | |
| 2010/0308662 A1* | 12/2010 | Schatz .................... | H02J 3/385 307/80 |
| 2010/0321148 A1 | 12/2010 | Gevorkian | |
| 2011/0218687 A1 | 9/2011 | Hadar et al. | |
| 2012/0033392 A1 | 2/2012 | Golubovic et al. | |
| 2012/0227783 A1* | 9/2012 | Funk ...................... | H02S 40/34 136/244 |
| 2012/0316802 A1 | 12/2012 | Presher, Jr. et al. | |
| 2013/0307336 A1 | 11/2013 | Bundschuh et al. | |
| 2013/0314096 A1 | 11/2013 | Bundschuh et al. | |
| 2013/0314236 A1 | 11/2013 | Warren | |
| 2013/0320767 A1 | 12/2013 | Huang et al. | |
| 2013/0320778 A1 | 12/2013 | Hopf et al. | |
| 2014/0027069 A1 | 1/2014 | Oppizzi | |
| 2014/0233141 A1* | 8/2014 | Blemel .................... | H02H 7/20 361/78 |

OTHER PUBLICATIONS

"Remote Solar Isolator—Safety Switch for Solar", http://remotesolarisolator.com/, 1-5.

"SolarMagic SM 3320-RF-EV Slar Power Optimizer with RF Communications", http://www.ti.com/tool/solarmagic-solarpoweroptimizer-ref, 1-3.

"The Santon Emergency Switch Firefighter Safety with Photovoltaic Installation", http://www.santonswitchgear.com/fileadmin/user_upload/Afbeeldingen/EmergencySwitchFireFighterSafety/Emergency_Switch_Firefighter_Safety_june2010.pdf, 1-5.

"Rapid Shutdown Systems (RSS)", http://bentek.com/solar-products/safety-systems/rapid-shutdown-systems/, Aug. 2014, 1-2, Bentek Corporation.

"Remote Solar Isolator—Safety Switch for Solar", http://remotesolarisolator.com/, Aug. 2014, 1-5, Remote Solar Isolator Pty Ltd.

"Solar PV Emergency Shut Down Procedure", http://www.placefirst.co.uk/solar-pv-emergency-shut-down-procedure/, Aug. 2014, 1-3, Place First Ltd.

"SolarMagic SM 3320-RF-EV Slar Power Optimizer with RF Communications", http://www.ti.com/tool/solarmagic-solarpoweroptimizer-ref, Feb. 3, 2012, 1-3, Texas Instruments.

"The Santon Emergency Switch Firefighter Safety with Photovoltaic Installation", http://www.santonswitchgear.com/fileadmin/user_upload/Afbeeldingen/EmergencySwitchFireFighterSafety/Emergency_Switch_Firefighter_Safety_june2010.pdf, Jun. 2010, 1-5, Santon.

"Tigo Energy PV-Safe", http://www.tigoenergy.com/sites/default/files/pv-safe_onepager.pdf, Jan. 23, 2014, 1, Tigo Energy.

\* cited by examiner

PV STAX—MULTI-FUNCTION JUNCTION MF/J SYSTEM

CROSS-REFERENCE TO RELATED APPLICATIONS

This application is a continuation-in-part of U.S. patent application Ser. No. 14/204,395, (now Pat. No. 9,791,835) filed on Mar. 11, 2014, entitled "PV Stop Potential Voltage and Hazard Stop System", which itself claims priority to and the benefit of U.S. Provisional Patent Application Ser. No. 61/778,048, filed on Mar. 12, 2013, entitled "Solar PV Safety Switch and Status Indicator System", and U.S. Provisional Patent Application Ser. No. 61/819,640, filed on May 5, 2013, entitled "PV Stop Potential Voltage and Hazard Stop System". This Application also claims priority to and the benefit of U.S. Provisional Patent Application Ser. No. 62/039,379, filed on Aug. 19, 2014, entitled "PV Stax—Multi-Function Junction MF/J System", and the specifications and claims thereof are incorporated herein by reference.

STATEMENT REGARDING FEDERALLY SPONSORED RESEARCH OR DEVELOPMENT

Not Applicable

INCORPORATION BY REFERENCE OF MATERIAL SUBMITTED ON COMPACT DISC

Not Applicable

COPYRIGHTED MATERIAL

©Chuck McCune. A portion of the disclosure of this patent document contains material that is subject to copyright protection. The owner has no objection to the facsimile reproduction by anyone of the patent document or the patent disclosure, as it appears in the Patent and Trademark Office patent file or records, but otherwise reserves all copyrights whatsoever.

BACKGROUND OF THE INVENTION

Field of the Invention (Technical Field)

The present invention relates to devices and methods for manually or automatically controlling assemblies of devices through electronic and electro-mechanical means, to shut down, restart, modify input/output, invert, rectify, optimize, enhance safety, provide format matching of device inter-locking and connection interfaces for electro-mechanical function, water proofing, electrical connection junctions, coupling of devices, coupling of industry standard devices by existing and future add-on equipment/devices, rapid plug/unplug (plug and play) devices in field installations and factory parts/device assemblies of power, liquids, or gases to buildings or facilities in case of emergencies, for adding or removing ganged assemblies and equipment, reconfiguration, maintenance and service and for manual or automated control in other situations.

Background Art

The present invention relates to the PV ("potential voltage") Solar photovoltaic panel, the Solar electricity industry, Electrical contracting, First Responder Fire/Emergency Medical Services ("EMS"), Solar photovoltaic service technicians, and electrical and fire safety, manufacturing, automation, robotic, conveyor system, public or private utility, wind turbine, mechanical contracting, gas, fuel process piping of air, gas, chemical, any material, any system that would benefit from a fast means of connection for safety switching and safety control electro-mechanical devices or any system that could benefit by a secure fastening, rapid coupling/stacking system for adding micro inverters, Maximum Power Point Tracking (MPPT), DC to DC converters, optimizers, individual controllers and data logging of equipment and in particular module level control electronics for Solar photovoltaic modules or concentrated Solar photovoltaic and Energy Storage/utilization systems.

BRIEF SUMMARY OF THE INVENTION

Objects, advantages and novel features, and further scope of applicability of the present invention will be set forth in part in the detailed description to follow, taken in conjunction with the accompanying FIGS. 1-5, and in part will become apparent to those skilled in the art upon examination of the following, or may be learned by practice of the invention. The objects and advantages of the invention may be realized and attained by means of the instrumentalities and combinations particularly pointed out in the appended claims.

The present invention provides a system of stackable self-registering, water proof J-box sleeves covers and MF/J boxes to stack or add on a multiplicity of devices and enclosures to an electrical junction box or a MF/J box as described and claimed in the invention.

The inventive device or system provides a mean to add into the MF/J box enclosures, any number of electrical, electro-mechanical or other control devices to provide for modularity or plug and play rapid installation or removal/replacement, upgrading, assembly and disassembly of stacked MF/J boxes and the enclosed devices.

The inventive device or system provides for a multiplicity of connectors, contacts, leads, wiring harnesses, and varying configurations of electro-mechanical devices.

The inventive device or system provides for the control of the devices within the MF/J boxes through a central control panel such as PV Stop, Fire, and Alarm or other control and command generating systems for electrical and mechanical devices.

BRIEF DESCRIPTION OF THE SEVERAL VIEWS OF THE DRAWINGS

The accompanying drawings FIGS. 1-5 in the attachment, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

1. PV Stax Multi-Function/Junction Base
2. Locking Female Clip Receiver for Male clip (4)
3. PV Stax Multi-Function/Junction Cover
4. Locking Male Clip
5. PV Stax Multi-Function/Junction Cover with Outlet Receptacle
6. PV Stax Multi-Function/Junction Outlet Receptacle
7. PV Stax Multi-Function/Junction Micro-Inverter or DC to DC Converter
8. PV Stax Multi-Function/Junction Micro-Inverter AC Leads
9. DC Leads 10. PV Stax Multi-Function/Junction Micro-Inverter or DC to DC Converter Male Plug

DETAILED DESCRIPTION OF THE INVENTION

Figure 1:
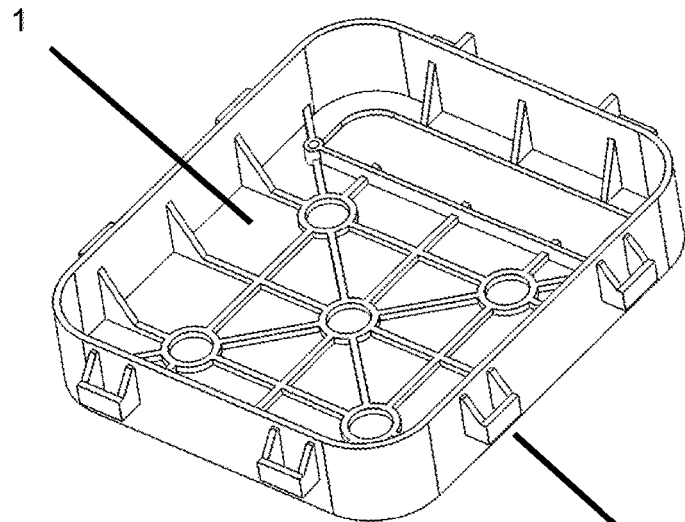
FIG. 1 is a schematic drawing of a PV Stax Multi-Function/Junction Base depicting the MF/J base box 1, configured with Locking Female Clip Receiver 2.
Figure 2:
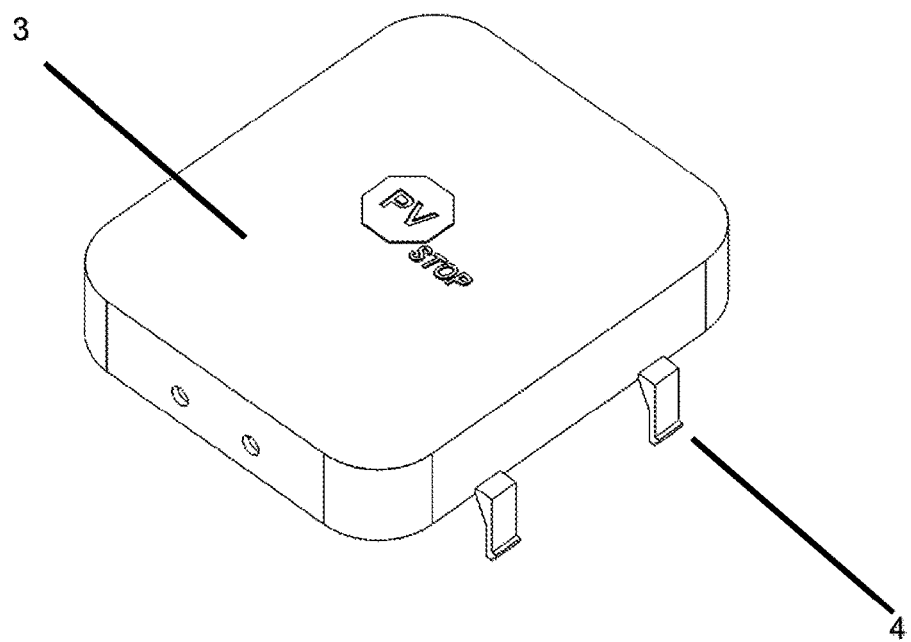
FIG. 2 is a schematic drawing of PV Stax Multi-Function/Junction Cover 3, configured with Locking Male Clip 4.
Figure 3:
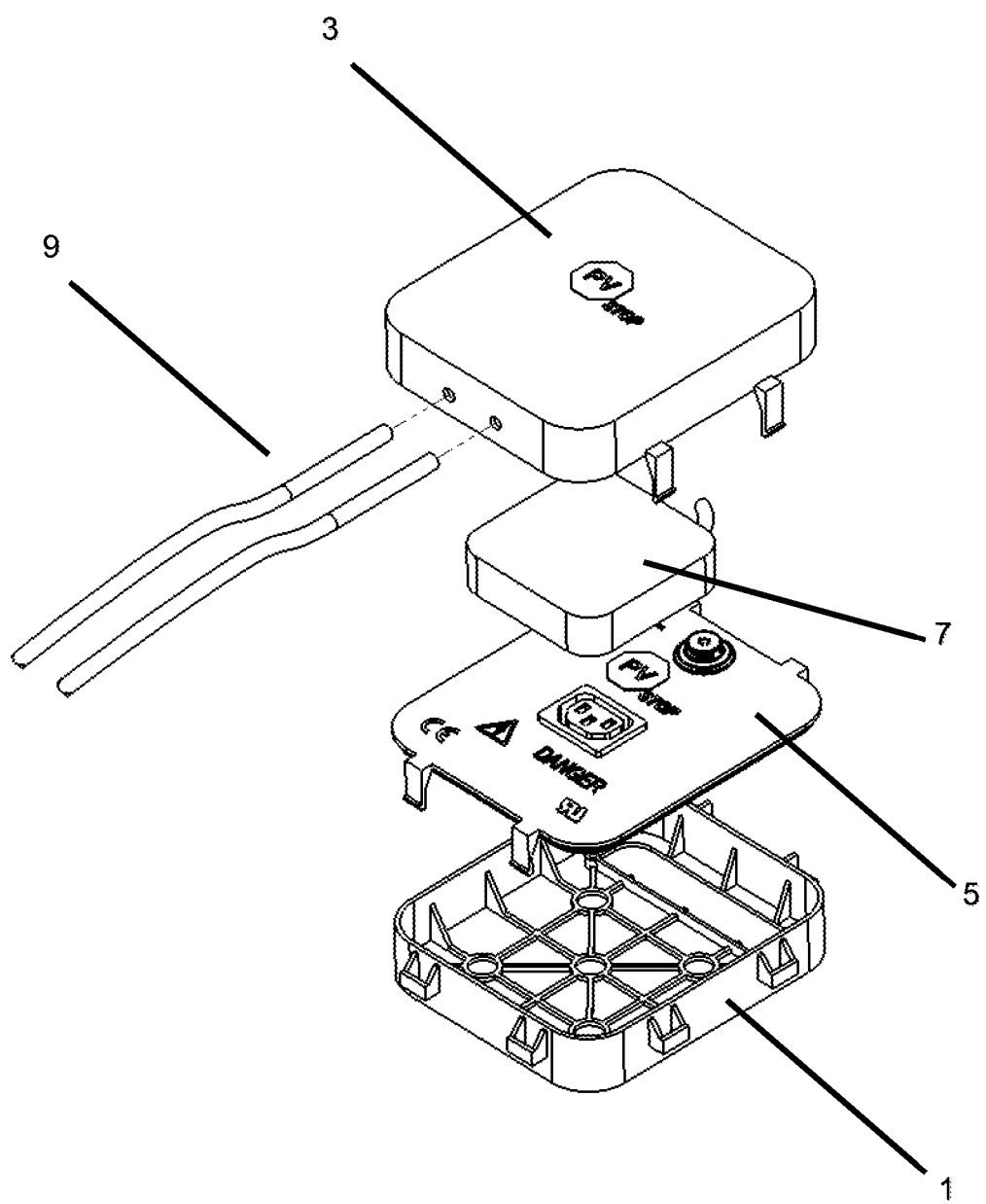
FIG. 3 is a schematic drawing of an exploded assembly of multiple possible configurations of PV Stax Multi-Function/Junction MF/J System Components depicting a PV Stax Multi-Function/Junction Cover 3, with DC Leads 9, MF/J Micro inverter or DC to DC Converter 7, a PV Stax Multi-Function/Junction Cover 5, with MF/J Outlet Receptacle 6, and a MF/J Base 1.
Figure 4:
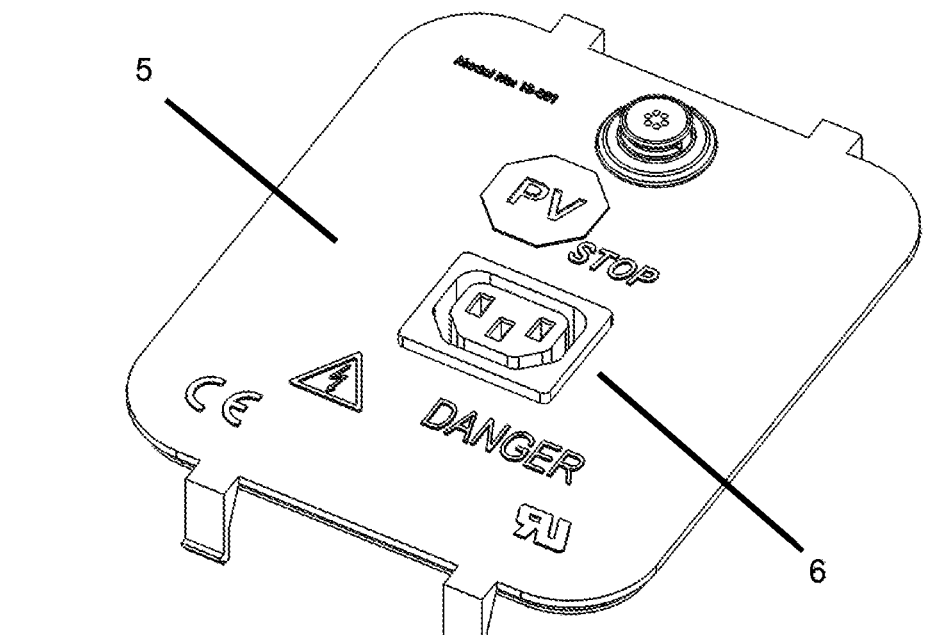
FIG. 4 is a schematic drawing depicting a PV Stax Multi-Function/Junction MF/J Cover 5, with a MF/J Outlet Receptacle 6.
Figure 5:
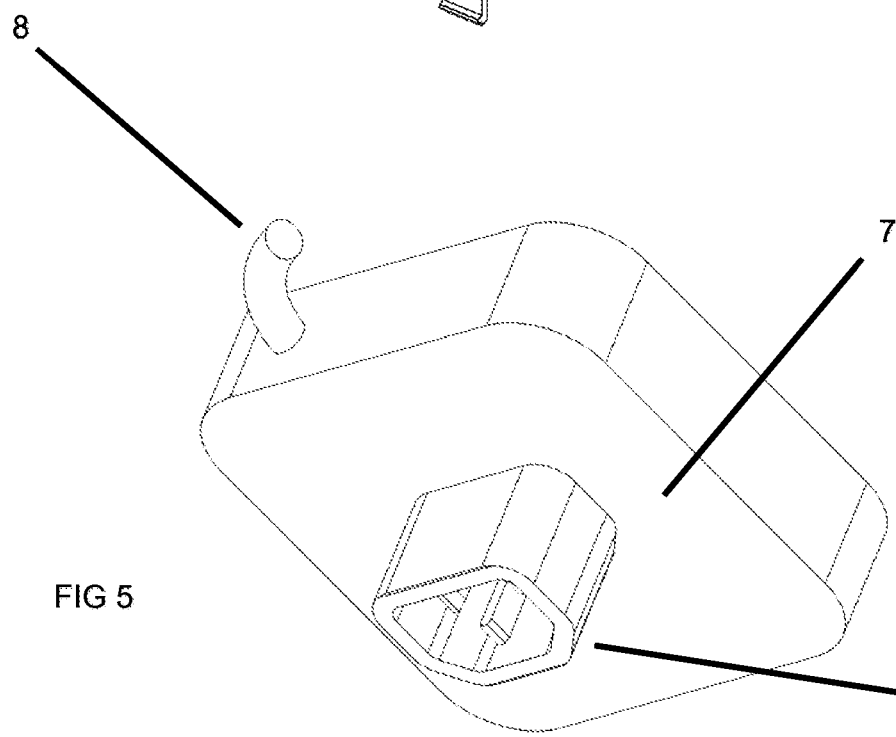
FIG. 5 is a schematic drawing depicting a PV Stax Multi-Function/Junction Micro-Inverter 7, with AC Leads 8, and MF/J Male Plug 10.

As depicted in FIGS. 1-5 A system to provide a multi-function connection capability to contain and provide for stacking, mounting self-registering Multi-Function Junction (MF/J) boxes that contain a multiplicity of control electronics and can be stacked, removed, replaced, and/or upgraded with a minimal of steps or connection processes in order to simplify methods and conserve on or add value, capabilities to materials and electrical/mechanical equipment. The system can be engaged or utilized by any EMS/First Responder/Service Technician, authorized personnel in any field, Contractor, manufacturer, Balance of Systems ("BOS") integrator and any assembler of systems that require a multiplicity of interfacing devices to be in proximity, connection or contact to each other, including Standard Electrical Boxes and enclosures, DC to DC Converters, Micro-Inverters, Module Level Control Electronics, Safety Systems, Monitoring Systems, Rapid Shutdown Systems, Micro Processors and power Semi Conductors. The invention is further described in the documents attached hereto, PV Stax Multi-Function Junction (MF/J) box Drawings pages 1/3, 2/3, 3/3. Industrial, Residential and Commercial Applicability The invention is further illustrated by the following non-limiting examples.

EXAMPLE 1

Standard photovoltaic J box or MF/J Base box mounted on a photovoltaic module fitted with a MF/J box, containing Diodes, with stackable add on that contains Module Level Control Electronics.

EXAMPLE 2

Standard MF/J Module Base J box mounted on a photovoltaic module fitted with a MF/J box add on that contains a DC to DC converter.

EXAMPLE 3

Standard MF/J Module J box mounted on a photovoltaic module fitted with a MF/J box add on that contains a Micro Inverter.

EXAMPLE 4

Standard MF/J Module Base J box mounted on a photovoltaic module fitted with a MF/J box add on fitted with connections, Diodes and DC leads.

What is claimed is:

1. A system for personnel at readily accessible locations comprising:
   one or more electrical, mechanical, transmitting and receiving devices, microprocessors and controllers configured to relay and/or switch on from a normally open configuration or off from a normally closed configuration, the source or line supply of all potentially hazardous equipment or energized/charged systems in a facility;
   a visible and/or audible indicator configured to allow a first responder or system maintenance crew to have definitive on or off status of the source or line supply;
   said system configured to require a lockout code sequence and/or mechanical lock out apparatus to re-energize the source or line supply; and
   wherein a modular main control panel enclosure containing a communications module is configured to:
   transmit and receive data to/from junction boxes/enclosures that are paired to the devices, and a processor board handling all front panel peripherals, displays, devices, and interaction, interfacing the main control box to external devices, and for supporting protocols for remote operation and telemetry, data logging for performance and forensic applications, and interaction with security and/or fire systems.

2. The system of claim 1 wherein said main control panel enclosure monitors contact closures that are interfaced to devices to allow the devices to request a shutdown of a photovoltaic module or modules.

3. The system of claim 1 additionally comprising a power interrupting/reconnecting and status notification system for Solar photovoltaic or other Solar energy/heating power system or other electrical power source.

4. The system of claim 3 additionally comprising components for power interrupting/reconnecting on individual, multiple strings, or entire arrays of solar energy producing systems.

* * * * *